US 9,985,047 B2

(12) United States Patent
Lee

(10) Patent No.: US 9,985,047 B2
(45) Date of Patent: May 29, 2018

(54) METHOD OF MANUFACTURING SEMICONDUCTOR DEVICE

(71) Applicant: SK hynix Inc., Gyeonggi-do (KR)

(72) Inventor: Seung Cheol Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 71 days.

(21) Appl. No.: 15/188,430

(22) Filed: Jun. 21, 2016

(65) Prior Publication Data

US 2017/0207235 A1 Jul. 20, 2017

(30) Foreign Application Priority Data

Jan. 19, 2016 (KR) .................. 10-2016-0006599

(51) Int. Cl.
| | |
|---|---|
| *H01L 27/115* | (2017.01) |
| *H01L 23/522* | (2006.01) |
| *H01L 23/528* | (2006.01) |
| *H01L 21/768* | (2006.01) |
| *H01L 27/11582* | (2017.01) |
| *H01L 21/28* | (2006.01) |
| *H01L 27/1157* | (2017.01) |
| *H01L 49/02* | (2006.01) |

(52) U.S. Cl.
CPC .. *H01L 27/11582* (2013.01); *H01L 21/28282* (2013.01); *H01L 21/76814* (2013.01); *H01L 21/76816* (2013.01); *H01L 21/76877* (2013.01); *H01L 23/528* (2013.01); *H01L 23/5226* (2013.01); *H01L 27/1157* (2013.01); *H01L 28/00* (2013.01)

(58) Field of Classification Search
CPC ......... H01L 21/76816; H01L 21/76814; H01L 21/28282
See application file for complete search history.

(56) References Cited

U.S. PATENT DOCUMENTS

| | | | | |
|---|---|---|---|---|
| 2009/0068834 | A1* | 3/2009 | Hyun ................ | H01L 21/76831 438/637 |
| 2011/0207323 | A1* | 8/2011 | Ditizio ................ | B81C 1/00087 438/675 |
| 2015/0155297 | A1* | 6/2015 | Eom ................ | H01L 27/11582 438/268 |

FOREIGN PATENT DOCUMENTS

| | | |
|---|---|---|
| KR | 101164953 | 7/2012 |
| KR | 1020150019336 | 2/2015 |

* cited by examiner

*Primary Examiner* — Mounir Amer
(74) *Attorney, Agent, or Firm* — IP & T Group LLP

(57) ABSTRACT

Disclosed is a method of manufacturing a semiconductor device, including: forming a multi-layered stack; forming a vertical hole in the stack; forming a plurality of material layers over a bottom and a sidewall of the vertical hole, wherein the plurality of material layers includes a first material layer and a second material layer, wherein the second material layer is provided under the first material layer; patterning the first material layer located over the bottom of the vertical hole to form a first opening, wherein the first opening exposes the second material layer; and patterning the second material layer exposed by the first opening using a difference in an etch rate between the first material layer and the second material layer.

20 Claims, 12 Drawing Sheets

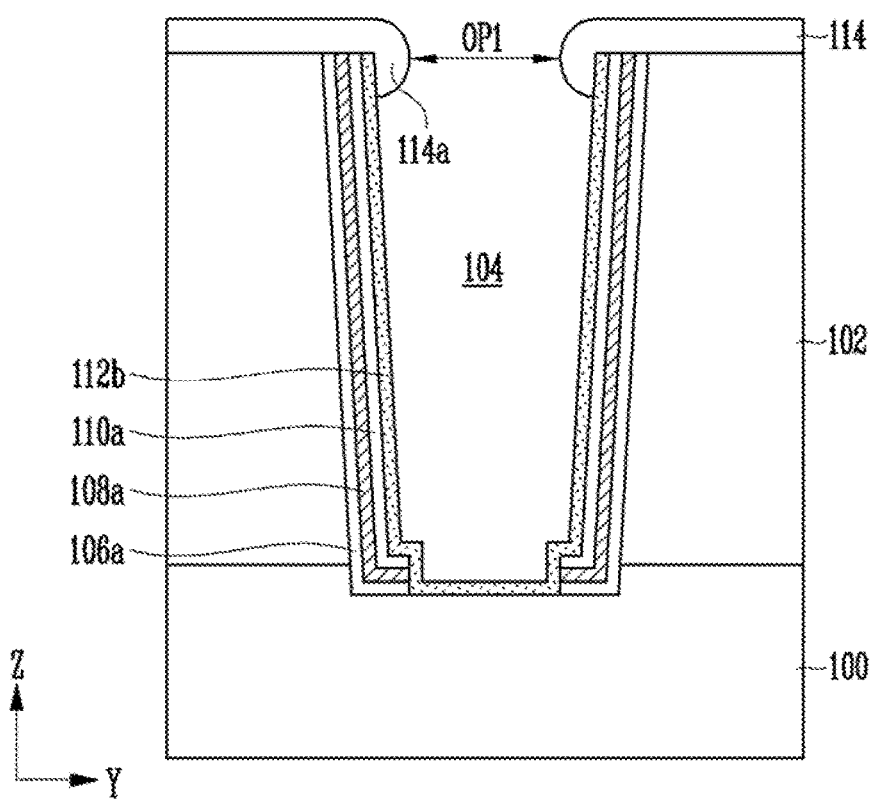

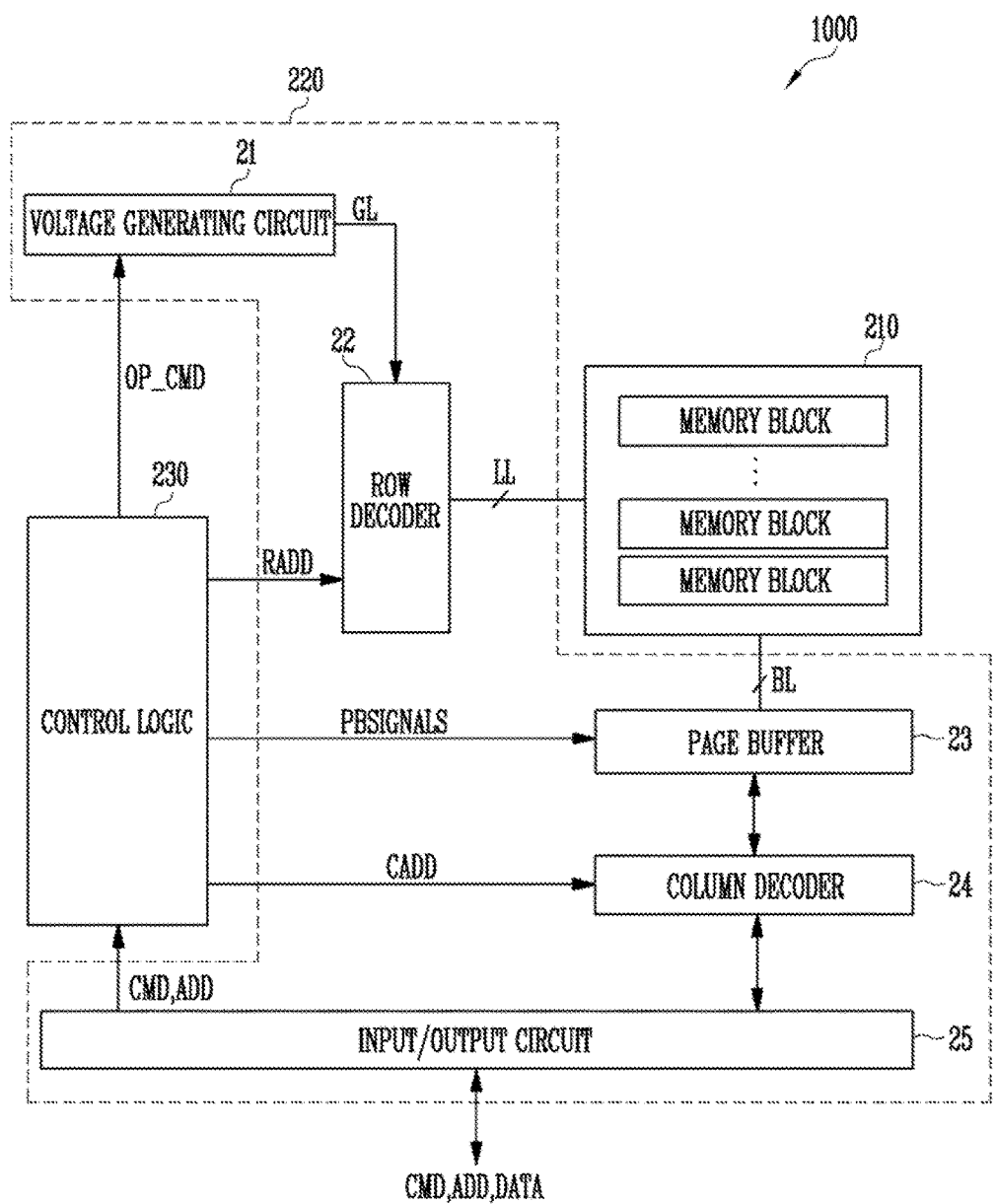

METHOD OF MANUFACTURING SEMICONDUCTOR DEVICE

CROSS-REFERENCE TO RELATED APPLICATION

The present application claims priority to Korean patent application number 10-2016-0006599 filed on Jan. 19, 2016, the entire disclosure of which is herein incorporated by reference in its entirety.

BACKGROUND

1. Field

The present disclosure relates to a method of manufacturing a semiconductor device, and more particularly, to a method of manufacturing a three-dimensional semiconductor device.

2. Description of the Related Art

A three-dimensional (3D) semiconductor device, in which memory cells are formed in a 3D structure for high integration of the semiconductor device, has been suggested. A 3D semiconductor device is capable of efficiently utilizing an area of a substrate when compared to a two-dimensional (2D) semiconductor device, therefore, the 3D semiconductor device may easily improve a degree of integration.

Recently, due to a high demand for portable electronic devices, research on high-integration and large capacity semiconductor devices have been actively conducted. Among the semiconductor devices which are widely used, is a flash memory device, in which stored data is maintained even though a supply of power is cut off.

The flash memory device may include a memory cell array, in which data is stored, a peripheral circuit which performs program, read, and erase operations of the memory cell array, and a control circuit controlling the peripheral circuit. The memory cell array may include a plurality of memory blocks. Each of the memory blocks may include a plurality of vertical strings.

In the 3D semiconductor device, the vertical strings may be vertically formed on a semiconductor substrate. For example, the vertical strings may include a plurality of select transistors and memory cells vertically stacked on the substrate.

The vertical strings may be formed in a Bit-Cost Scalable (BICS) or Pipe-shape Bit-Cost Scalable (P-BICS) structure according to a form thereof. The vertical strings in the BICS structure may be formed in a shape of "I", and the vertical strings in the P-BICS structure may be formed in a shape of "U". Since the vertical strings in the BICS structure are formed in a shape of "I", each of the vertical strings forms a unit structure. On the other hand, since the vertical strings in the P-BICS structure are formed in a shape of "U", a pair of vertical strings are connected with each other through a pipe channel to form a unit structure.

SUMMARY OF THE INVENTION

The present disclosure has been made in an effort to solve the above-described problems associated with the prior art, and provides a method of manufacturing a semiconductor device, which is capable of easily manufacturing a three-dimensional (3D) semiconductor device.

An exemplary embodiment of the present disclosure provides a method of manufacturing a semiconductor device, including: forming a multi-layered stack; forming a vertical hole in the stack; forming a plurality of material layers over a bottom and a sidewall of the vertical hole, wherein the plurality of material layers includes a first material layer and a second material layer, wherein the second material layer is provided under the first material layer; patterning the first material layer located over the bottom of the vertical hole to form a first opening, wherein the first opening exposes the second material layer; and patterning the second material layer exposed by the first opening using a difference in an etch rate between the first material layer and the second material layer.

Another exemplary embodiment of the present disclosure provides a method of manufacturing a semiconductor device, including: forming a first multi-layered stack over a source layer; forming a vertical hole within the first multi-layered stack; forming a second multi-layered stack over a bottom and a sidewall of the vertical hole, wherein the second multi-layered stack includes a blocking layer, a trap layer, and a tunnel insulating layer; forming a sub channel layer over the second multi-layered stack; patterning the sub channel layer located over the bottom of the vertical hole to form a sub channel pattern, wherein the sub channel pattern exposes the second multi-layered stack; and patterning the second multi-layered stack using the sub channel pattern as a mask to form a second multi-layered stack pattern and expose the source layer, wherein the second multi-layered stack pattern is patterned using an etch rate difference between the sub channel layer and each of the blocking layer, the trap layer, and the tunnel insulating layer.

According to the exemplary embodiment of the present disclosure, it is possible to easily form a 3D semiconductor device. Particularly, it is possible to easily form a vertical plug of a 3D semiconductor device.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of Illustration. It will be understood that when an element is referred to as being "between" two elements, it can be the only element between the two elements, or one or more intervening elements may also be present. Like reference numerals refer to like elements throughout.

FIGS. 1A to 1G are cross-sectional views for describing a method of manufacturing a semiconductor device according to an exemplary embodiment of the present disclosure.

FIG. 2 is a block diagram for describing a semiconductor device according to an exemplary embodiment of the present disclosure.

DETAILED DESCRIPTION OF THE INVENTION

Hereinafter, an exemplary embodiment of the present disclosure will be described in detail with reference to the accompanying drawings. However, the present disclosure is not limited to embodiments to be disclosed below, but various forms different from each other may be implemented.

Figure 1A:
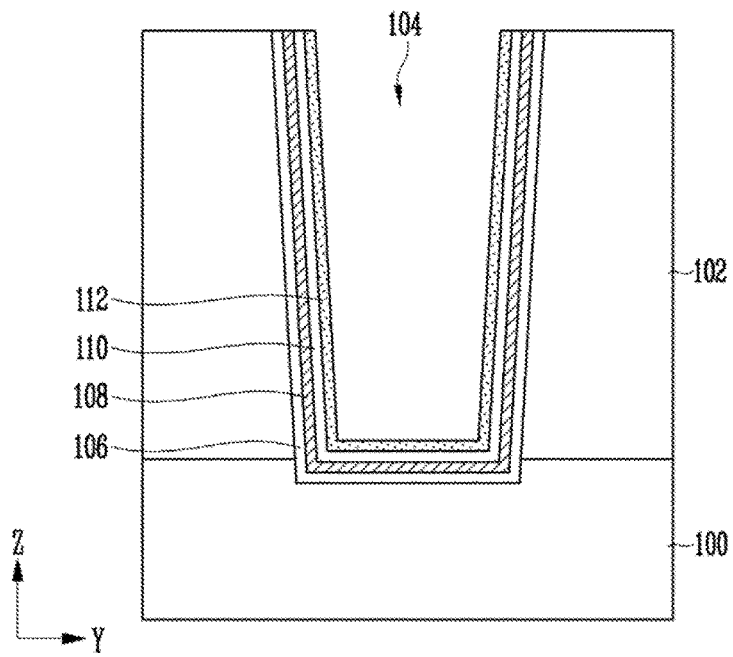

FIGS. 1A to 1G are cross-sectional views for describing a method of manufacturing a semiconductor device according to an exemplary embodiment of the present disclosure. Referring to FIG. 1A, a first material layer 102 is formed on a lower layer 100. The first material layer 102 may be a single layer or a multi-layer, in which a plurality of material layers is stacked.

A vertical region 104 is formed by etching a part of the first material layer 102. For example, a hard mask pattern (not illustrated), in which an opening is included in an etching target region, is formed on the first material layer 102, and the vertical region 104 may be formed by etching the first material layer 102 exposed through the opening until the lower layer 100 is exposed.

The vertical region 104 may be formed in a form of a hole or a trench. An inclination of a lateral surface of the vertical region 104 needs to be vertical to the lower layer 100, but it is difficult to form the lateral surface of the vertical region 104 to be vertical due to a characteristic of a manufacturing process. Furthermore, an inclination of a lateral surface of the vertical region 104 may have a negative inclination as being close to a lower side of the vertical region 104. For example, the vertical region 104 has a structure, in which a width thereof is decreased from an upper part to a lower part thereof.

Second to fifth material layers 106, 108, 110, and 112 are formed along a surface of the vertical region 104. Since the upper portion of the vertical region 104 is opened, the surface of the vertical region 104 may include the lateral surface and a bottom surface. For example, the lateral surface of the vertical region 104 may correspond to a lateral surface of the first material layer 102, and the bottom surface of the vertical region 104 may correspond to an upper surface of the lower layer 100 exposed through the vertical region 104.

The second to fifth material layers 106, 108, 110, and 112 may be made of materials having different etch rates. For example, the etch rates of the second material layer 106 and the third material layer 108 may be different from each other, the etch rates of the third material layer 108 and the fourth material layer 110 may be different from each other, and the etch rates of the fourth material layer 110 and the fifth material layer 112 may be different from each other.

The second to fifth material layers 106, 108, 110, and 112 may be formed on an upper portion of the first material 102, as well as the surface of the vertical region 104. A subsequent process may be performed in a state where the second to fifth material layers 106, 108, 110, and 112 are formed on the upper portion of the first material layer 102. In another embodiment, a subsequent process may be performed after the second to fifth material layers 106, 108, 110, and 112 formed on the upper portion of the first material layer 102 are removed.

A method of removing the second to fifth material layers 106, 108, 110, and 112 formed on the upper portion of the first material layer 102 may be performed by a chemical mechanical polishing (CMP) method. In another embodiment, other various etching methods may be performed, instead of the CMP. Hereinafter, the method will be described by using the structure, in which the second to fifth material layers 106, 108, 110, and 112 formed on the upper portion of the first material layer 102 are removed.

Figure 1B:
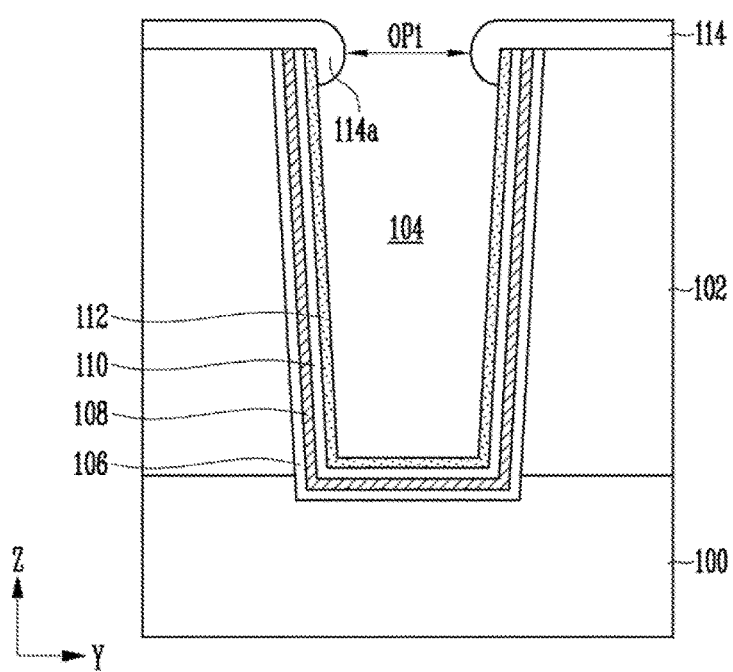

Referring to FIG. 1B, an etch mask pattern 114 is formed on an entire structure, in which the second to fifth material layers 106, 108, 110, and 112 are formed within the vertical region 104. The etch mask pattern 114 may be formed by various deposition methods. Particularly, when the etch mask pattern 114 is formed on the first material layer 102, an overhang 114a is generated around an upper edge of the fifth material layer 112, so that a width of an upper opening of the vertical region 104 may be decreased. The narrowed upper opening of the vertical region 104, of which the width is decreased due to the generation of the overhang 114a, is defined as a first opening OP1.

Figure 1C:
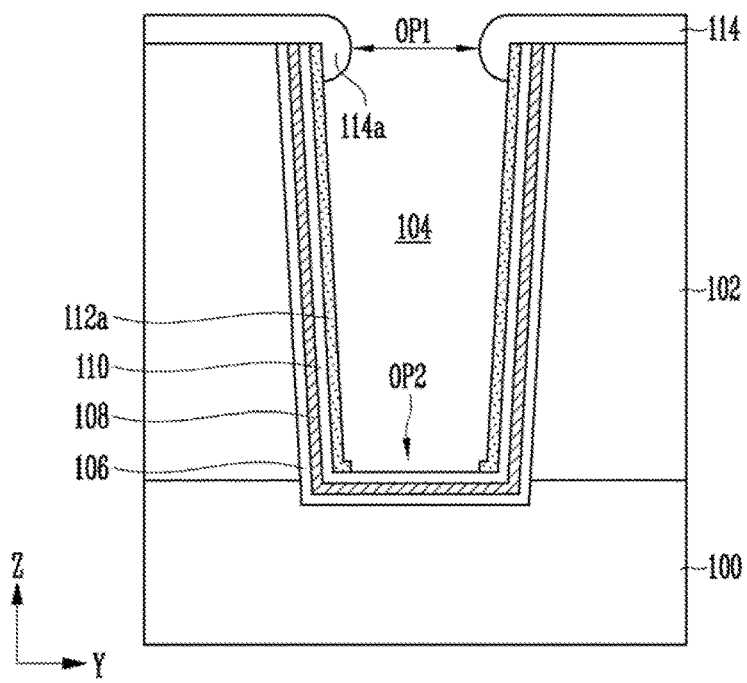

Referring to FIG. 1C, a second opening OP2 exposing a part of the fourth material layer 110 is formed in a lower portion of the vertical region 104 by performing a first etch process for removing a part of the fifth material layer 112 exposed through the first opening OP1 of the etch mask pattern 114. The fifth material layer 112 remaining on a lateral wall (also referred to as a sidewall) of the vertical region 104 becomes a fifth material pattern 112a.

The first etch process may be performed by an anisotropic dry etch process in order to remove the part of the fifth material layer 112 formed in the lower portion of the vertical region 104 to suppress damage to the fifth material pattern 112a formed on the lateral wall of the vertical region 104.

The first etch process may be performed by using source gas, which has a greater etch rate to the fifth material layer 112 than that to the fourth material layer 110. That is, the first etch process may be performed by using source gas, which has a greater etch speed to the fifth material layer than that of the fourth material layer 110. The fifth material pattern 112a may be used as an etch mask during a subsequently performed etch process.

Figure 1D:
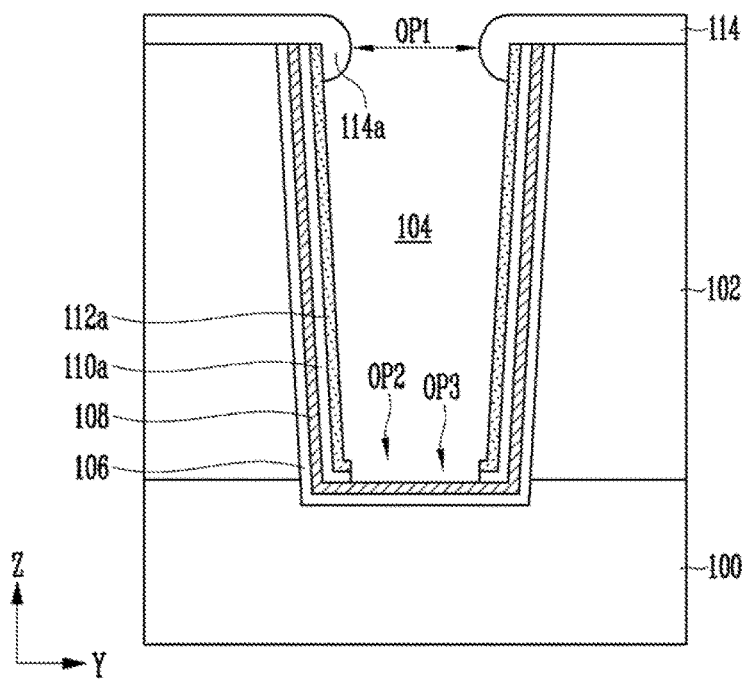

Referring to FIG. 1D, a second etch process for removing a part of the fourth material layer 110 exposed through the second opening OP2 is performed. The second etch process may be performed by a cleaning process. For example, the second etch process may be performed by a dry cleaning process using the fifth material pattern 112a as an etch mask. Since the part of the fourth material layer 110 is exposed through the second opening OP2 of the fifth material pattern 112a, the exposed fourth material layer 110 may be removed during the second etch process and a fourth material pattern 110a including a third opening OP3 may be formed.

The third material layer 108 may be exposed through the third opening OP3. The fifth material pattern 112a is used as an etch mask during the second etch process, so that the second etch process may be performed by using source gas, which has a greater etch rate when applied to the fourth material layer 110 than that of the fifth material pattern 112a. Preferably, the second etch process may be performed by using source gas, which has a low etch rate when applied to the fifth material pattern 112a.

Figure 1E:
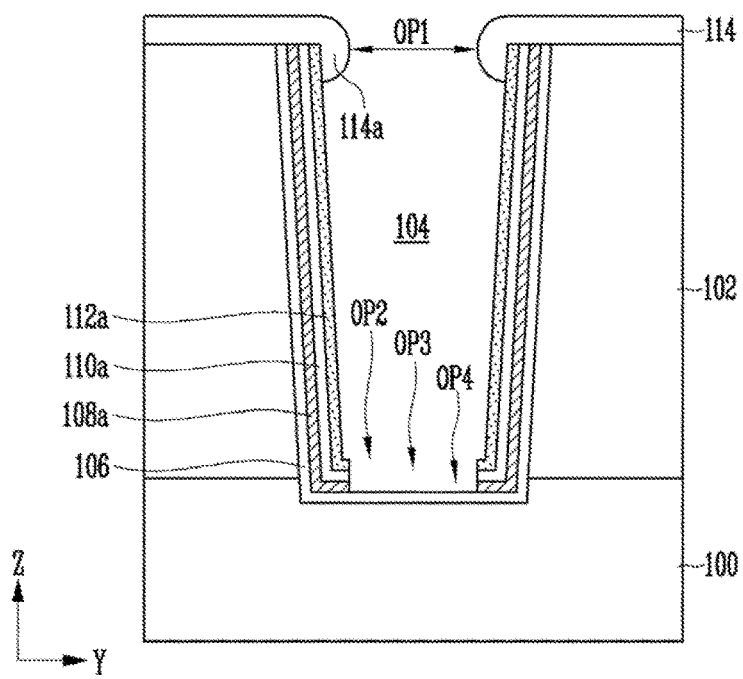

Referring to FIG. 1E, a third etch process for removing a part of the third material layer 108 exposed through the third opening OP3 is performed. The third etch process may be performed by a cleaning process. For example, the third etch process may be performed by a dry cleaning process using the fifth material pattern 112a as an etch mask. Since the part of the third material layer 108 is exposed through the third opening OP3, the exposed third material layer 108 is removed during the third etch process so that a third material pattern 108a including a fourth opening OP4 may be formed.

The second material layer 106 may be exposed through the fourth opening OP4. The fifth material pattern 112a is used as an etch mask during the third etch process so that the third etch process may be performed by using source gas, which has a greater etch rate when applied to the third material layer 108 than that of the fifth material pattern 112a. For example, the third etch process may be performed by using source gas, by which a ratio of an etch rate of the first material pattern 112a to the third material layer 108 at least 1:4.

Figure 1F:
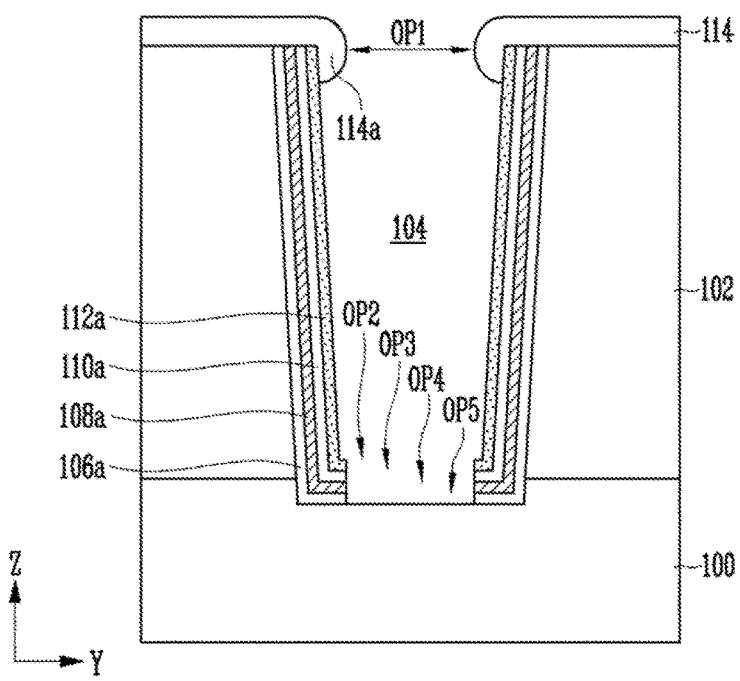

Referring to FIG. 1F, a fourth etch process for removing a part of the second material layer 106 exposed through the fourth opening OP4 is performed. The fourth etch process may be performed by a cleaning process. For example, the fourth etch process may be performed by a dry cleaning process using the fifth material pattern 112a as an etch mask. Since the part of the second material layer 106 is exposed through the fourth opening OP4, the exposed second material layer 106 is removed during the fourth etch process so that a second material pattern 106a including a fifth opening OP5 may be formed.

The lower layer 100 may be exposed through the fifth opening OP5. The fifth material pattern 112a is used as an etch mask during the fourth etch process so that the fourth etch process may be performed by using source gas, which has a greater etch rate when applied to second third material layer 106 than that of the fifth material pattern 112a. Preferably, the fourth etch process may be performed by using source gas, which has a low etch rate when applied to the fifth material pattern 112a.

Referring to FIG. 1G, etch damage may be generated to the fifth material pattern 112a during the performance of the first to fourth etch processes. To compensate for the etch damage of the fifth material pattern 112a, the sixth material layer 112b formed of the same material as that of the fifth material pattern 112a is formed along an internal surface of the vertical region 104 including the lower layer 100 exposed through the fifth opening OP5.

As described above, when the plurality of material layers is formed along the internal surface of the vertical region 104, the lower material layers exposed through the first opening OP1 may be removed by performing the etch process using a difference in etch rate after the opening, OP2, OP3, OP4, or OP5 is formed by removing a part of the material layer formed at the topmost end. An exemplary embodiment, to which the aforementioned manufacturing method is applicable, will be described in detail below.

FIG. 2 is a block diagram for describing a semiconductor device according to an exemplary embodiment of the present disclosure. Referring to FIG. 2, a semiconductor device 1000 includes a memory cell array 210 in which data is stored, a peripheral circuit 220 configured to perform program, read, or erase, operations of the memory cell array 210, and a control circuit 230 configured to control the peripheral circuit 220.

The memory cell array 210 includes a plurality of memory blocks which are configured to be substantially the same as each other. Each of the memory blocks may include a plurality of cell strings formed in a 3D structure. Each of the plurality of cell strings may include a plurality of memory cells in which data is stored, and have a 3D structure in which the plurality of cell strings is vertically arranged on a substrate. Each of the memory cells may be formed of single level cells SLC in which data of 1 bit may be stored, or multi-level cells MLC, triple level cells (TLC), or quadruple level cells (QLC) in which 2 bits of data or more may be stored. For example, the MLCs are cells in which 2 bits of data are stored in each memory cell, the TLCs are cells in which 3 bits of data are stored in each memory cell, and the QLCs are cells in which 4 bits of data are stored in each memory cell.

The peripheral circuit 220 includes a voltage generating circuit 21, a row decoder 22, a page buffer 23, a column decoder 24, and an input/output circuit 25.

The voltage generating circuit 21 generates operation voltages having various levels in response to an operation signal OP_CMD, and applies the generated operation voltages to global lines GL. For example, the voltage generating circuit 21 may generate a program voltage, a read voltage, and an erase voltage. In addition, the voltage generating circuit 21 may generate various voltages necessary for various operations.

The row decoder 22 selects one among the memory blocks included in the memory cell array 110 in response to a row address RADD, and transmits operation voltages to local lines LL connected to the selected memory block. For example, the local lines LL may include source select lines, word lines, and drain select lines.

The page buffer 23 is connected with the memory blocks through bit lines BL. The page buffer 23 transceives data with the selected memory block in response to page buffer control signals PBSIGNALS during program, read, and erase operations, and temporarily stores the received data.

The column decoder 24 transmits data between the page buffer 23 and the input/output circuit 25 in response to a column address CADD.

The input/output circuit 25 transmits a command CMD and an address ADD received from the outside to the control circuit 130, transmits data DATA received from the outside to the column decoder 24, and outputs data DATA received from the column decoder 24 to the outside.

The control circuit 130 controls the peripheral circuit 120 in response to the command CMD and the address ADD. For example, the control circuit 230 may control the peripheral circuit 220 to perform the program operation, the read operation, or the erase operation in response to the command CMD.

Figure 3:
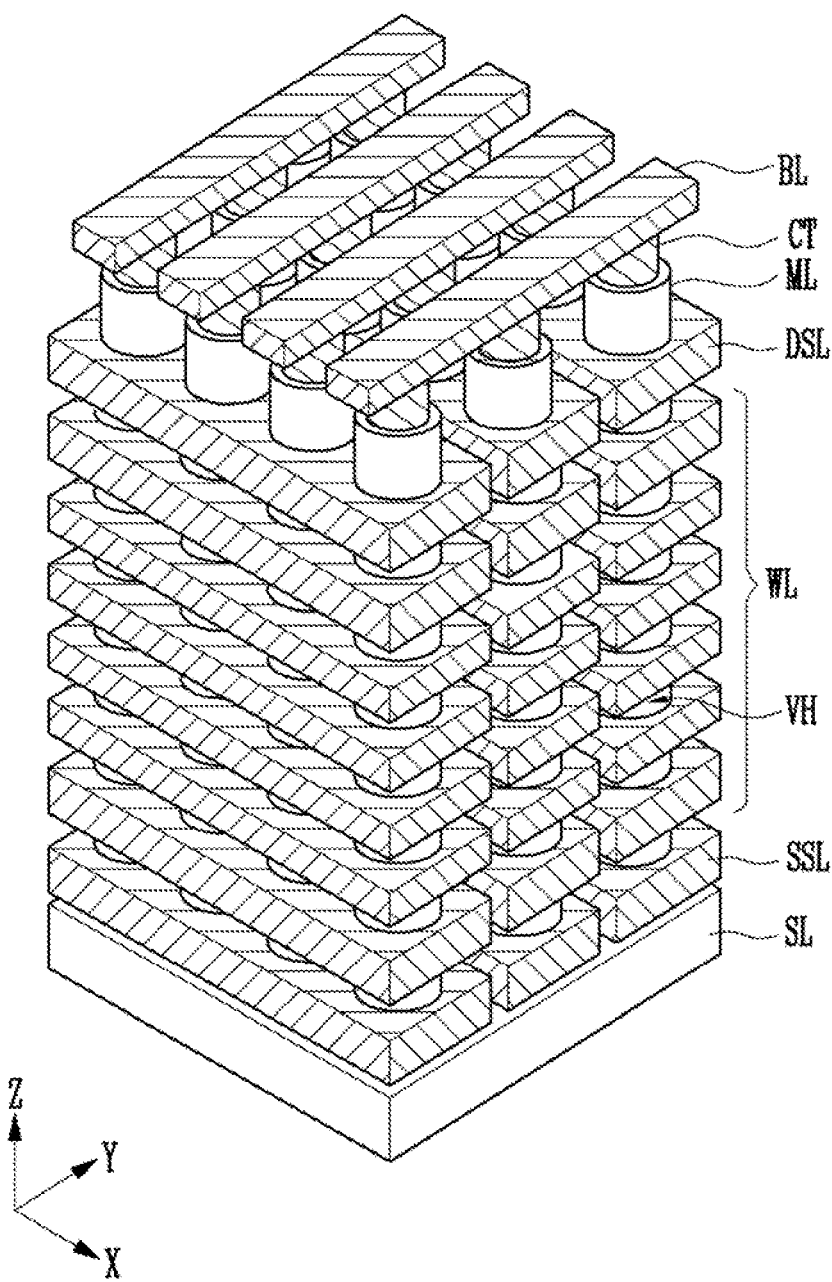
FIG. 3 is a perspective view for describing a memory block of a 3D semiconductor device in detail.

FIG. 3 is a perspective view for describing the memory block of the 3D semiconductor device in detail. Referring to FIG. 3, the memory block in the 3D structure may include cell strings, which are vertically arranged on the substrate and have a shape of "I".

The cell strings may be vertically arranged between the bit lines BL and the common source line CSL. The structure may also be called Bit Cost Scalable (BICS). For example, when a common source line CSL is horizontally formed on the substrate, the cell strings having the BICS structure may be formed on the common source line CSL in a vertical direction. More particularly, the cell strings may include source select transistors, memory cells, and drain select transistors which are formed along a memory layer ML formed in a cylindrical shape on the common source line CSL. Although not illustrated in the drawings, a vertical channel layer may be formed inside the memory layer ML. The channel layer may be formed in a cylindrical shape.

The source select transistors are connected to the source select lines SSL, the memory cells are connected to the word lines WL, and the drain select transistors are connected to the drain select lines DSL. The source select lines SSL, the word lines WL, and the drain select lines DSL are sequentially stacked on the common source line CSL while being spaced apart from each other, and are extended in the X-direction and are spaced apart from each other in the Y-direction. The X-direction and the Y-direction are parallel to an upper surface of the substrate and are orthogonal to each other. The memory layer ML may be formed inside vertical holes VH, which vertically pass through the source select lines SSL, the word lines WL, and the drain select lines DSL, and a part of the memory layer ML may protrude to upper portions of the drain select lines DSL.

The bit lines BL may be formed on the memory layer ML which is protruding from the upper portions of the drain select lines DSL. The bit lines BL may be formed in a direction orthogonal to the word lines WL. For example, the bit lines BL are extended in the Y-direction and are spaced apart from each other in the X-direction. A contact plug CT may be further formed between the memory layer ML and the bit lines BL.

The manufacturing method of forming the memory layer ML inside the vertical hole VH among the aforementioned configurations will be described in detail below. FIGS. 4A to 4H are cross-sectional views for describing a method of manufacturing a semiconductor device according to an exemplary embodiment of the present disclosure.

Figure 4A:
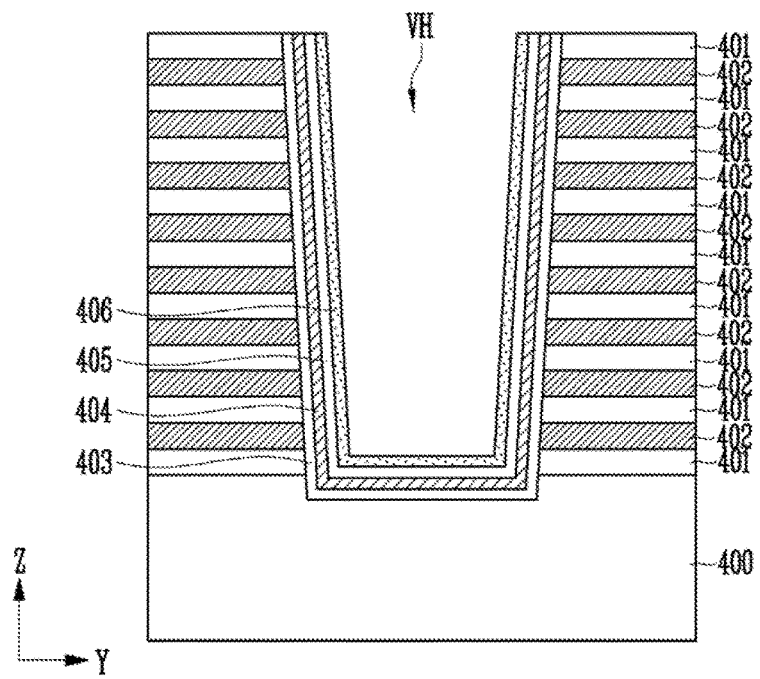
FIGS. 4A to 4H are cross-sectional views for describing a method of manufacturing a semiconductor device according to an exemplary embodiment of the present disclosure.

Referring to FIG. 4A, first stack layers 401 and second stack layers 402 are alternately stacked on a source layer 400. The source layer 400 may be formed on a substrate. The first stack layers 401 may be formed of insulating layers. For example, the insulating layers may be oxide layers.

The second stack layers 402 may be formed of sacrificial layers or conductive layers according to a manufacturing method. For example, the sacrificial layer may be a nitride layer and the conductive layer may be a polysilicon layer. When the sacrificial layer is formed, the sacrificial layer may be removed and the conductive layer may replace the sacrificial layer during a subsequent process.

A vertical hole VH is formed by partially etching the first and second stack layers 401 and 402. For example, a hard mask pattern (not illustrated), in which an opening is formed in an etch target region, is formed on the first and second stack layers 401 and 402, and the vertical hole VH may be formed by etching the first and second stack layers 401 and 402 exposed through the opening until the source layer 400 is exposed.

An inclination of a lateral surface or a sidewall of the vertical hole VH needs to be vertical to the source layer 400, but it is difficult for the lateral surface of the vertical hole VH to be vertical due to a characteristic of a manufacturing process. Furthermore, an Inclination of a lateral surface of the vertical hole VH may have a negative inclination as being close to a lower side of the vertical hole VH. For example, the width of the vertical hole VH narrows as the vertical hole VH deepens. That is, when a first level is located lower than a second level, a width of the vertical hole VH measured at the first level is narrower than a width of the vertical hole VH measured at the second level.

A blocking layer 403, a trap layer 404, a tunnel insulating layer 405, and a sub channel layer 406 are sequentially formed on a sidewall surface of the vertical hole VH. The blocking layer 403, the trap layer 404, and the tunnel insulating layer 405, in combination, may form a memory layer.

Since an upper portion of the vertical hole VH is opened, the surface of the vertical hole VH may Include a lateral portion and a lower portion. For example, the first and second stack layers 401 and 402 may be included in the lateral portion of the vertical hole VH, and an upper surface of the source layer 400 which is exposed through the vertical hole VH may be included in the lower portion.

Each of the blocking layer 403, the trap layer 404, and the tunnel insulating layer 405 may be formed of a material having a different etch rate from that of the sub channel layer 406. For example, the blocking layer 403 may be formed of an insulating layer, for example, an oxide layer. The trap layer 404 is a layer, in which electrons are trapped, and may be formed of a nitride layer. The tunnel layer 405 may be formed of an insulating layer, for example, an oxide layer. The sub channel layer 406 is a layer for forming a channel and may be formed of, for example, a polysilicon layer.

The blocking layer 403, the trap layer 404, the tunnel insulating layer 405, and the sub channel layer 406 may also be formed on a region, on which the first and second stack layers 401 and 402 are stacked, as well as the internal surface of the vertical hole VH.

A subsequent process may be performed in a state in which the blocking layer 403, the trap layer 404, the tunnel insulating layer 405, and the sub channel layer 406 are formed on the first and second stack layers 401 and 402. In another embodiment, a subsequent process may be performed after the blocking layer 403, the trap layer 404, the tunnel insulating layer 405, and the sub channel layer 406 formed on the first and second stack layers 401 and 402 are removed. A method of removing the blocking layer 403, the trap layer 404, the tunnel insulating layer 405, and the sub channel layer 406 formed on the first and second stack layers 401 and 402 may be performed by a chemical mechanical polishing (CMP) method or other various etching methods may be performed. In the following embodiment, the blocking layer 403, the trap layer 404, the tunnel insulating layer 405, and the sub channel layer 406 formed on the first and second stack layers 401 and 402 are removed before a subsequent process.

Figure 4B:
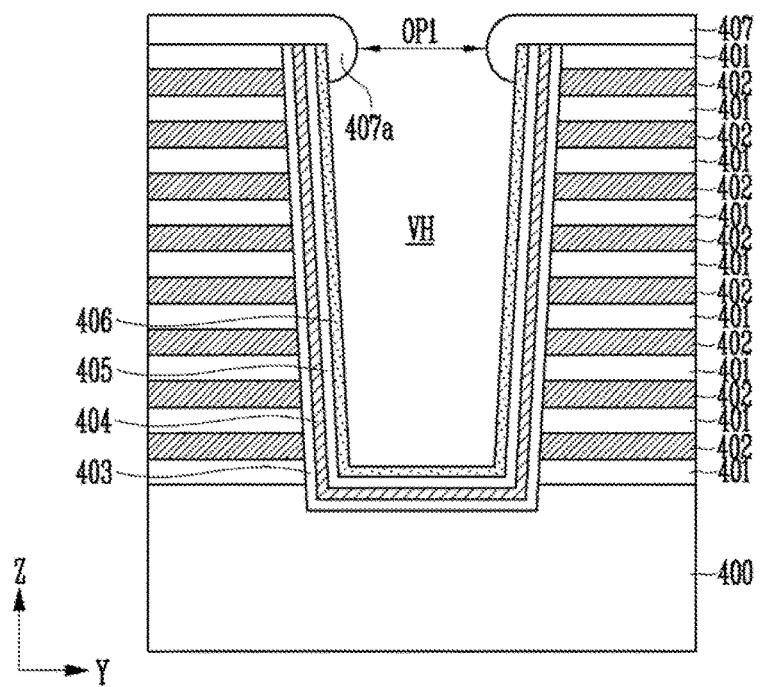

Referring to FIG. 4B, an etch mask pattern 407 is formed in the entire structure, in which the blocking layer 403, the trap layer 404, the tunnel insulating layer 405, and the sub channel layer 406 are formed within the vertical hole VH. The etch mask pattern 407 may be formed by various deposition methods. For example, when the etch mask pattern 407 is formed on the first and second stack layers 401 and 402, an overhang 407a is generated around an upper edge of the sub channel layer 406 so that a width of an upper opening of the vertical hole VH may be decreased. The upper opening of the vertical hole VH, of which the width is decreased due to the generation of the overhang 407a, is defined as a first opening OP1.

Figure 4C:
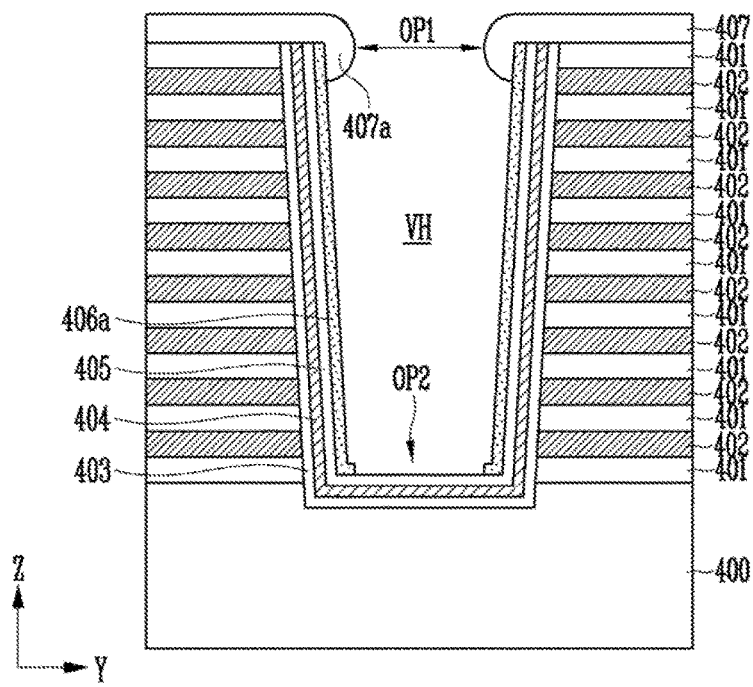

Referring to FIG. 4C, a second opening OP2 exposing a part of the tunnel insulating layer 405 is formed in a lower portion of the vertical hole VH by performing a first etch process for removing a part of the sub channel layer 406 exposed through the first opening OP1 of the etch mask pattern 407. The remaining sub channel layer 406 in the vertical hole VH becomes a sub channel pattern 406a.

The first etch process may be performed by an anisotropic dry etch process in order to suppress damage to the remaining sub channel pattern 406a. The first etch process may be performed by using source gas, which has a greater etch rate when applied to the sub channel layer 406 than that of the tunnel insulating layer 405. That is, the first etch process may be performed by using source gas, which has a greater etch speed when applied the sub channel layer 406 than that of the tunnel insulating layer 405. The sub channel pattern 406a may be used as an etch mask during a subsequent etch process.

Figure 4D:
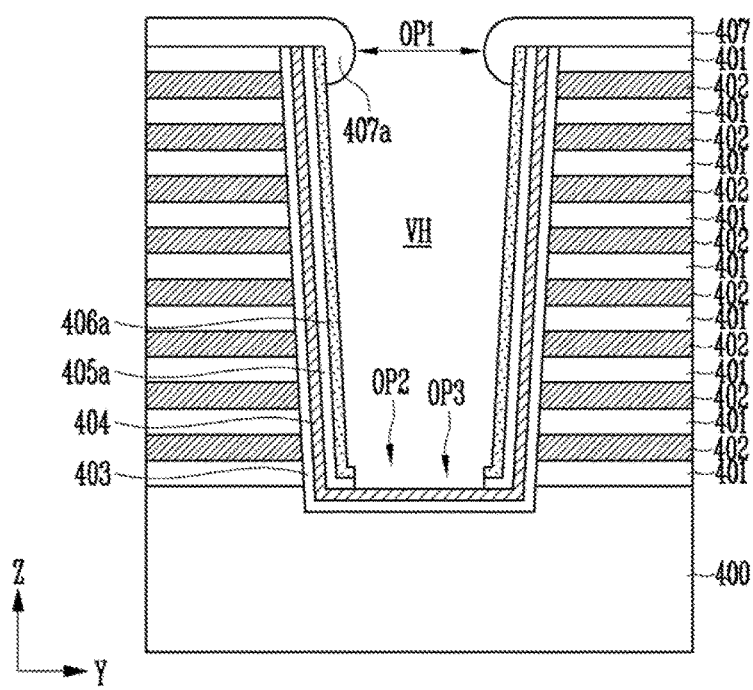

Referring to FIG. 4D, a second etch process for removing a part of the tunnel insulating layer 405 exposed through the second opening OP2 is performed. The second etch process may be performed by a cleaning process. For example, the second etch process may be performed by a dry cleaning process using the sub channel pattern 406a as an etch mask. Since part of the tunnel insulating layer 405 is exposed through the second opening OP2 of the sub channel pattern 406a, the exposed tunnel insulating layer 405 may be removed during the second etch process and a tunnel insulating pattern 405a including a third opening OP3 may be formed.

The trap layer 404 may be exposed through the third opening OP3. Since the sub channel pattern 406a is used as an etch mask during the second etch process, the second etch process may be performed by using source gas which has higher etch selectivity when applied to the tunnel insulating layer 405 than that of the sub channel pattern 406a. Preferably, the second etch process may be performed by using source gas which has a low etch rate when applied to the sub channel pattern 406a.

Figure 4E:
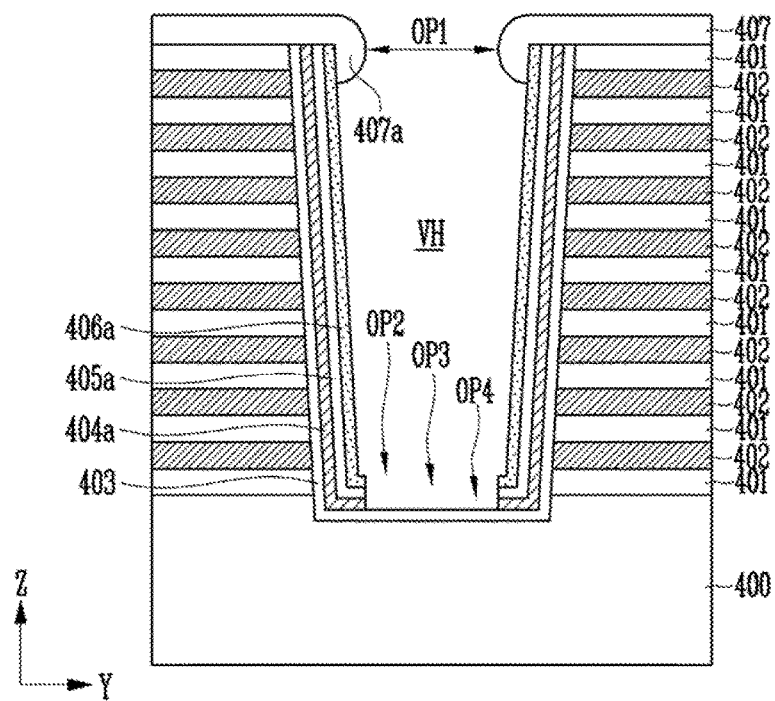

Referring to FIG. 4E, a third etch process for removing a part of the trap layer 404 exposed through the third opening OP3 is performed. The third etch process may be performed by a cleaning process. For example, the third etch process may be performed by a dry cleaning process using the sub channel pattern 406a as an etch mask. Since the part of the trap layer 404 is exposed through the third opening OP3, the exposed trap layer 404 is removed during the third etch process so that a trap pattern 404a including a fourth opening OP4 may be formed.

The blocking layer 403 may be exposed through the fourth opening OP4. Since the sub channel pattern 406a is used as an etch mask during the third etch process, the third etch process may be performed by using source gas which has a greater etch rate when applied to the trap layer 404 than that the sub channel pattern 406a. For example, the third etch process may be performed by using source gas with an etch rate to the sub channel pattern 406a to an etch rate to the trap layer 404 of at least 1:4.

Figure 4F:
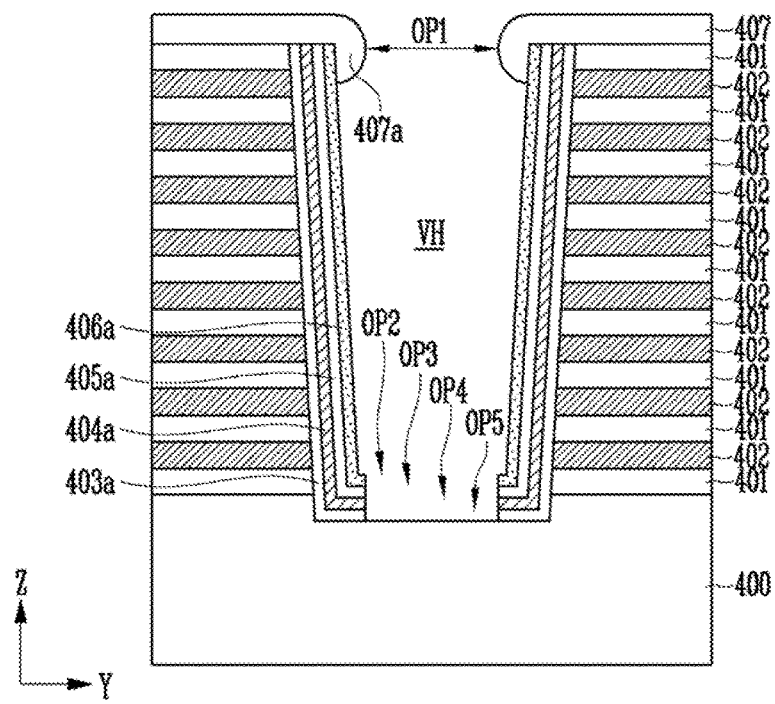

Referring to FIG. 4F, a fourth etch process for removing a part of the blocking layer 403 exposed through the fourth opening OP4 is performed. The fourth etch process may be performed by a cleaning process. For example, the fourth etch process may be performed by a dry cleaning process using the sub channel pattern 406a as an etch mask. Since the part of the blocking layer 403 is exposed through the fourth opening OP4, the exposed blocking layer 403 is removed during the fourth etch process so that a blocking pattern 403a and a fifth opening OP5 may be formed.

The source layer 400 may be exposed through the fifth opening OP5. Since the sub channel pattern 406a is used as an etch mask during the fourth etch process, the fourth etch process may be performed by using source gas which has a greater etch rate when applied to the blocking layer 403 than that of the sub channel pattern 406a. Preferably, the fourth etch process may be performed by using source gas which has a low etch rate when applied to the sub channel pattern 406a.

Figure 4G:
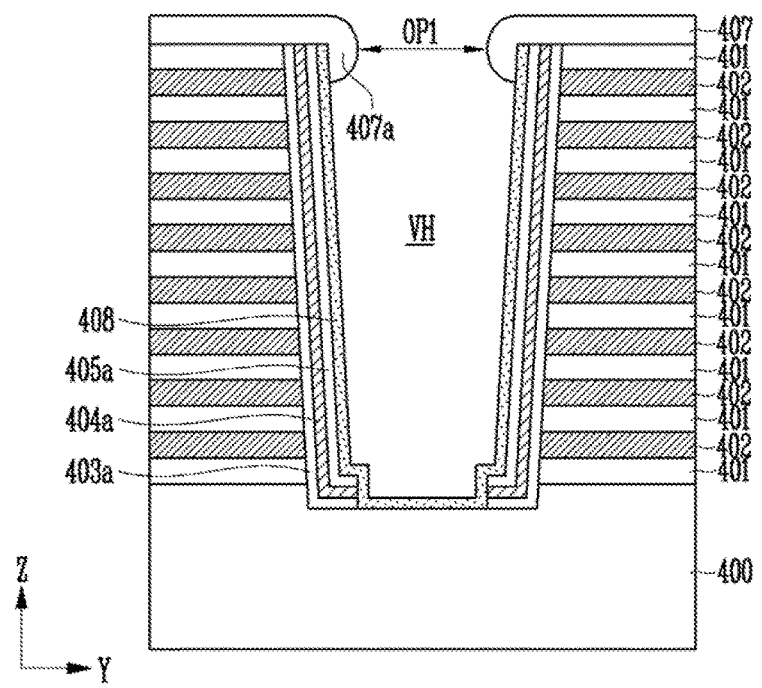

Referring to FIG. 4G, etch damage may be generated to the sub channel pattern 406a during the performance of the first to fourth etch processes. To compensate for the etch damage of the sub channel pattern 406a, a main channel layer 408 formed of the same material as that of the sub channel pattern 406a is formed over the internal surface of the vertical hole VH including the source layer 400 exposed through the fifth opening OP5. For example, the main channel layer 408 may be a polysilicon layer. Accordingly, the main channel layer is in contact with the source layer 400 to serve as a vertical channel.

In another embodiment, before the main channel layer 408 is formed, a cleaning process for removing a part of a surface of the sub channel pattern 406a, to which an etch damage may be generated, may be further performed. The cleaning process is a wet cleaning process and may be performed by using an aqueous solution of which an etch ratio to an oxide layer to the sub channel pattern 406a is at least 1:10. After the wet cleaning process is performed, a dry cleaning process may be further performed for removing a residue, which may be generated in the previous process, and removing a part of the surface of the sub channel pattern 406a which remains after performing the wet cleaning process. The dry cleaning process may be performed by using gas of which a etch ratio to an oxide layer to the sub channel pattern 406a is at least 1:100.

Figure 4H:
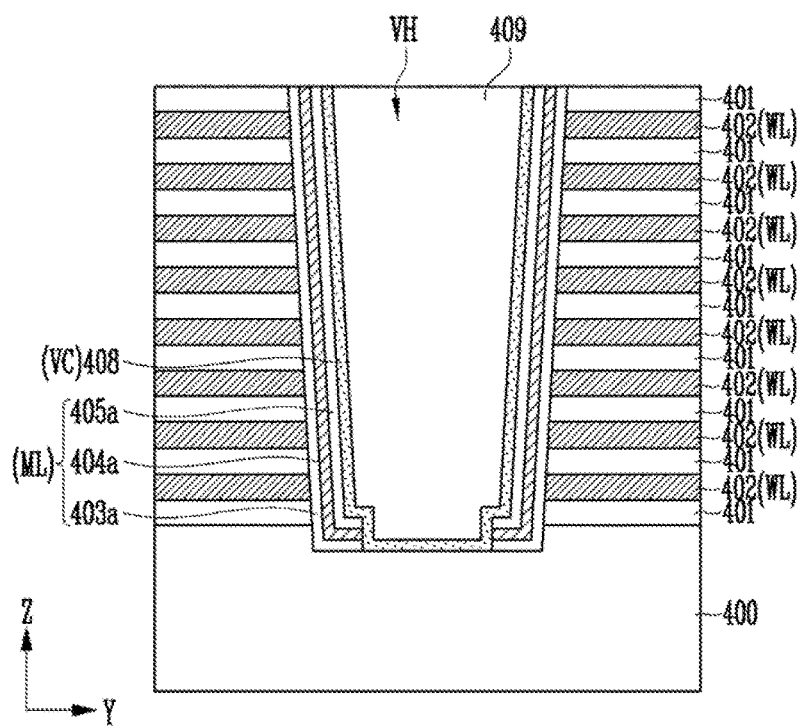

Referring to FIG. 4H, after the etch mask pattern 407 and the overhang 407a are removed, a vertical insulating layer 409 is formed inside the vertical hole VH, in which the main channel layer 408 is formed. The vertical insulating layer 409 may be an oxide layer. The main channel layer 408 may be a vertical channel layer VC within the string. The blocking pattern 403a, the trap pattern 404a, and the tunnel insulating pattern 405a may be the memory layer ML described with reference to FIG. 3. Accordingly, a vertical plug including the vertical insulating layer 409, the vertical channel layer VC, and the memory layer ML is formed.

As described above, a plurality of material layers is formed over a bottom and a sidewall of the vertical hole VH. The plurality of material layers includes a topmost material layer and the remaining material layers provided under the topmost material layer. The vertical hole VH has a given width at its top level. The etch mask pattern 407 is formed over a top surface of the vertical hole VH and extends over a top edge of the vertical hole VH to form the overhang 407a. Due to the overhang 407a, the width of the vertical hole VH at the top level narrows. A plurality of material layers located over the bottom of the vertical hole VH are exposed through the overhang 407a and removed by performing the etch process using an etch rate difference between the topmost material layer and the remaining material layers. Further, the aforementioned exemplary embodiment may also be applied to a manufacturing process of a structure, in which the plurality of vertical holes is stacked.

Figure 5:
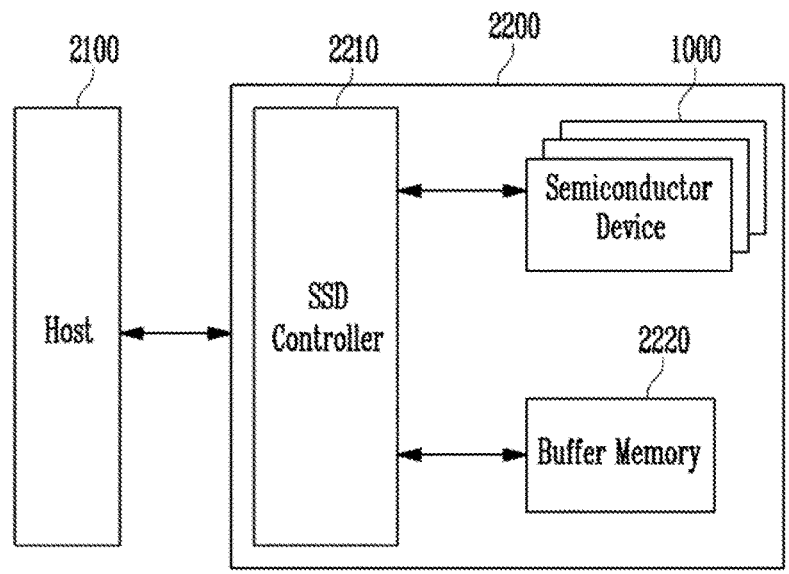
FIG. 5 is a block diagram illustrating a solid state drive including the semiconductor device according to the exemplary embodiment of the present disclosure.

FIG. 5 is a block diagram for describing a solid state drive including the semiconductor device according to the exemplary embodiment of the present disclosure. Referring to FIG. 5, a drive device 2000 includes a host 2100 and a Solid Disk Drive (SSD) 2200. The SSD 2200 includes an SSD controller 2210, a buffer memory 2220, and the semiconductor device 1000.

The SSD controller 2210 physically connects the host 2100 and the SSD 2200. That is, the SSD controller 2210 provides interfacing with the SSD 2200 in accordance with a bus format of the host 2100. Particularly, the SSD controller 2210 decodes a command provided from the host 2100. The SSD controller 2210 accesses the semiconductor device 1000 according to a result of the decoding. The bus format of the host 2100 may include a Universal Serial Bus (USB), a Small Computer System Interface (SCSI), PCI process, ATA, Parallel ATA (PATA), Serial ATA (SATA), or Serial Attached SCSI (SCSI).

Program data provided from the host 2100 and data read from the semiconductor device 1000 is temporarily stored in the buffer memory 2220. When data existing in the semiconductor device 1000 is cached when a read request is made from the host 2100, the buffer memory 2200 supports a cache function of directly providing the cached data to the host 2100. In general, a data transmission speed by the bus format (for example, SATA or SAS) of the host 2100 may be greater than a transmission speed of a memory channel. That is, when an interface speed of the host 2100 is greater than the transmission speed of the memory channel of the SSD 2200, it is possible to minimize degradation of performance due to a speed difference by providing the buffer memory 2220 with a large capacity. The buffer memory 2220 may include a synchronous DRAM so that the SSD 2200 used as an auxiliary memory device with a large capacity provides sufficient buffering.

The semiconductor device 1000 serves as a storage medium of the SSD 2200. For example, the semiconductor device 1000 may include a non-volatile memory device having large capacity storage performance as described with reference to FIG. 1, particularly, a NAND-type flash memory among the non-volatile memory devices.

Figure 6:
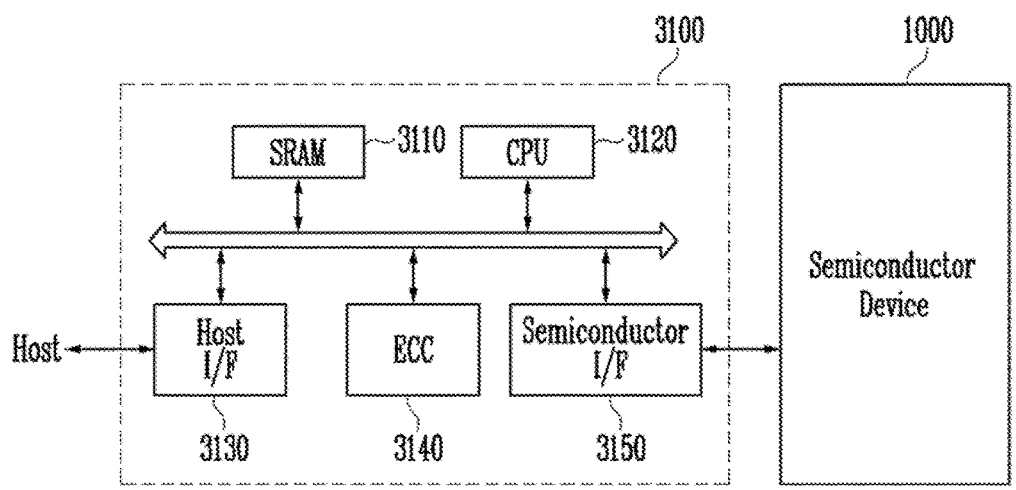
FIG. 6 is a block diagram for describing a memory system including the semiconductor device according to the exemplary embodiment of the present disclosure.

FIG. 6 is a block diagram for describing a memory system including the semiconductor device according to the exemplary embodiment of the present disclosure. Referring to FIG. 6, a memory system 3000 according to the present disclosure may include a memory controller 3100 and the semiconductor device 1000. The semiconductor device 1000 may have a configuration substantially the same as that of FIG. 2. Thus, a detailed description of the semiconductor device 1000 will be omitted.

The memory controller 3100 may be configured to control the semiconductor device 1000. The SRAM 3110 may serve as a working memory of a CPU 3120. A host interface (Host I/F) 3130 may include a data exchange protocol of a host connected with the memory system 3000. An error correction circuit (ECC) 3140 provided in the memory controller 3100 may detect and correct an error included in data read from the semiconductor device 1000. A semiconductor interface (semiconductor I/F) 3150 may interface with the semiconductor device 1000. The CPU 3120 may perform a control operation for exchanging data with the memory controller 3100. Although not Illustrated in FIG. 6, the memory system 3000 may further include a ROM (not illustrated) for storing code data for interfacing with the host.

The memory system 3000 according to the present disclosure may be applied to a computer, a portable terminal, a Ultra Mobile PC (UMPC), a work station, a net-book computer, a PDA, a portable computer, a web tablet PC, a wireless phone, a mobile phone, a smart phone, a digital camera, a digital audio recorder, a digital audio player, a digital picture recorder, a digital picture player, a digital video recorder, a digital video player, a device capable of transceiving information in a wireless environment, various devices configuring a home network, etc.

Figure 7:
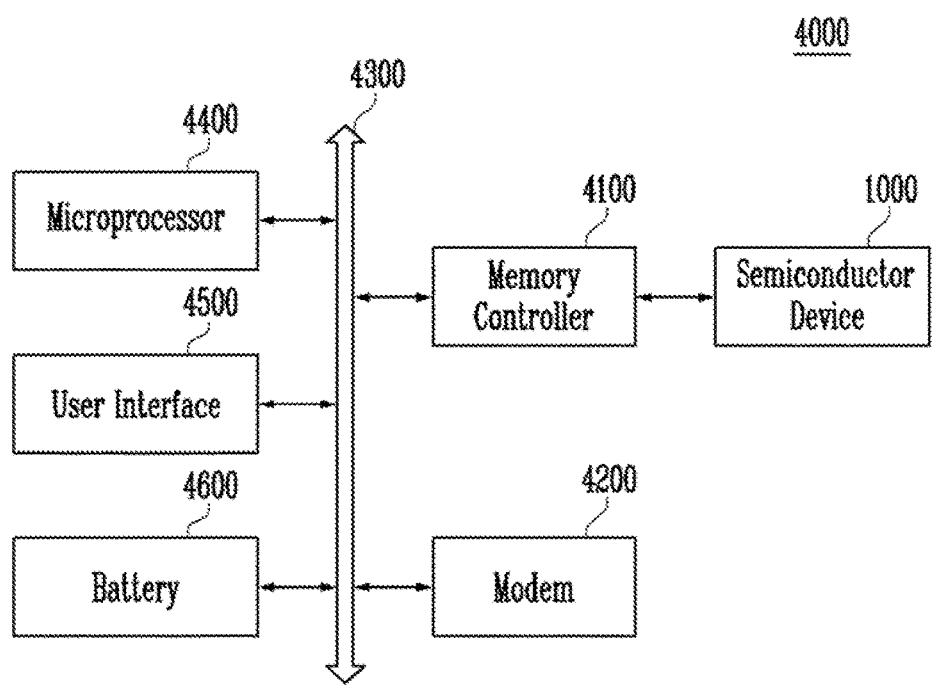
FIG. 7 is a diagram for describing a schematic configuration of a computing system including the semiconductor device according to the exemplary embodiment of the present disclosure.

FIG. 7 is a diagram for describing a schematic configuration of a computing system including the semiconductor device according to the exemplary embodiment of the present disclosure. Referring to FIG. 7, a computing system 4000 according to the present disclosure includes the semiconductor device 1000, a memory controller 4100, a modem 4200, a microprocessor 4400, and a user interface 4500 which are electrically connected to a bus 4300. In a case where the computing system 4000 according to the present disclosure is a mobile device, a battery 4600 for supplying an operating voltage of the computing system 4000 may be further provided. Although it is not illustrated in the drawings, the computing system 4000 according to the present disclosure may further include an application chipset, a Camera Image Processor (CIS), a mobile DRAM, and the like.

The semiconductor device 1000 may have a configuration substantially the same as that of FIG. 2. Thus, a detailed description of the semiconductor device 1000 will be omitted. The memory controller 4100 and the semiconductor device 1000 may configure an SSD.

The semiconductor device and the memory controller according to the present disclosure may be embedded by using various forms of packages. For example, the semiconductor device and the memory controller according to the present disclosure may be embedded by using packages, such as package on package (PoP), ball grid arrays (BGAs), chip scale packages (CSPs), plastic leaded chip carrier (PLCC), plastic dual in line package (PDIP), die in waffle pack, die in wafer form, chip on board (COB), ceramic dual in line package (CERDIP), plastic metric quad flat pack (MQFP), thin quad flat pack (TQFP), small outline (SOIC), shrink small outline package (SSOP), thin small outline (TSOP), thin quad flat pack (TQFP), system in package (SIP), multi-chip package (MCP), wafer-level fabricated package (WFP), and wafer-level processed stack package (WSP).

The technical spirit of the present disclosure have been described in the exemplary embodiment in detail, but the exemplary embodiment has been described herein for purposes of illustration and does not limit the present disclosure. Further, those skilled in the art will appreciate that various modifications may be made without departing from the scope and spirit of the present disclosure.

What is claimed is:

1. A method of manufacturing a semiconductor device, comprising:
    forming a multi-layered stack;
    forming a vertical hole in the stack;
    forming a plurality of material layers over a bottom and a sidewall of the vertical hole, wherein the plurality of material layers includes a first material layer and a second material layer, wherein the second material layer is provided under the first material layer;
    patterning the first material layer located over the bottom of the vertical hole to form a first opening, wherein the first opening exposes the second material layer;
    patterning the second material layer exposed by the first opening using a difference in an etch rate between the first material layer and the second material layer to form a second opening; and
    forming a third material layer along a surface of the second opening and an internal surface of the vertical hole, wherein the third material layer is formed of a same material as the first material layer.

2. The method of claim 1,
    wherein the second material layer includes multiple layers stacked over each other, and
    wherein each of the multiple layers of the second material layer is patterned using an etch rate difference from the first material layer.

3. The method of claim 1, further comprising:
    forming an etch mask pattern over the multi-layered stack to have overhangs over an upper edge of the vertical hole before the first material layer is patterned,
    wherein the first opening is formed between the overhangs.

4. The method of claim 3,
wherein a width of the vertical hole at the upper edge narrows by the overhangs.

5. A method of manufacturing a semiconductor device, comprising:
   forming a first multi-layered stack over a source layer;
   forming a vertical hole within the first multi-layered stack;
   forming a second multi-layered stack over a bottom and a sidewall of the vertical hole, wherein the second multi-layered stack includes a blocking layer, a trap layer, and a tunnel insulating layer;
   forming a sub channel layer over the second multi-layered stack;
   patterning the sub channel layer located over the bottom of the vertical hole to form a sub channel pattern, wherein the sub channel pattern exposes the second multi-layered stack; and
   patterning the second multi-layered stack using the sub channel pattern as a mask to form a second multi-layered stack pattern and expose the source layer,
   wherein the second multi-layered stack pattern is patterned using an etch rate difference between the sub channel layer and each of the blocking layer, the trap layer, and the tunnel insulating layer.

6. The method of claim 5,
wherein the first multi-layered stack include first layers and second layers,
wherein the first layers and the second layers are alternately stacked over each other,
wherein each of the first layers is formed of an insulating layer, and
wherein each of the second layers is formed of a sacrificial layer or a conductive layer.

7. The method of claim 6,
wherein the Insulating layer includes an oxide layer,
wherein the sacrificial layer includes a nitride layer, and
wherein the conductive layer includes a polysilicon layer.

8. The method of claim 5,
wherein the vertical hole vertically passes through the first multi-layered stack and exposes the source layer.

9. The method of claim 5, wherein the forming a vertical hole Includes:
   forming an etch mask pattern extending from over the first multi-layered stack to over an upper edge of the vertical hole; and
   patterning the sub channel layer using the etch mask pattern.

10. The method of claim 9,
wherein the patterning of the sub channel layer is performed by an anisotropic dry etch process.

11. The method of claim 5,
wherein each of the blocking layer, the trap layer, and the tunnel insulating layer is etched at a higher speed than the sub channel layer.

12. The method of claim 11,
wherein each of the blocking layer, the trap layer, and the tunnel insulating layer is patterned by a dry cleaning process.

13. The method of claim 5, further comprising:
performing a cleaning process after exposing the source layer to partly remove the sub channel pattern to form a second sub channel pattern.

14. The method of claim 13, further comprising:
forming a main channel layer over the second sub channel pattern after performing the cleaning process.

15. The method of claim 5, further comprising:
performing a cleaning process to completely remove the sub channel pattern and expose the second multi-layered stack pattern after forming the second multi-layered stack pattern.

16. The method of claim 15, further comprising:
forming a main channel layer over the exposed second multi-layered stack pattern after performing the cleaning process.

17. The method of claim 16,
wherein the cleaning process is performed by a wet cleaning process and a dry cleaning process is performed using a gas source.

18. The method of claim 17,
wherein the dry cleaning process is performed after the performing of the wet cleaning process.

19. The method of claim 17,
wherein the wet cleaning process is performed using an aqueous solution, and
wherein each of the aqueous solution and the gas has a greater etch rate when applied to the sub channel pattern than to an oxide layer.

20. The method of claim 5, further comprising:
forming a main channel layer over the sub channel pattern after the source layer is exposed.

* * * * *